(12) United States Patent
Kim et al.

(10) Patent No.: US 9,117,592 B2
(45) Date of Patent: Aug. 25, 2015

(54) MULTILAYER CERAMIC ELECTRONIC COMPONENT AND MOUNTING BOARD THEREFOR

(71) Applicant: SAMSUNG ELECTRO-MECHANICS CO., LTD., Suwon, Gyunggi-Do (KR)

(72) Inventors: Wi Heon Kim, Gyunggi-Do (KR); Dae Bok Oh, Gyunggi-Do (KR); Jae Yeol Choi, Gyunggi-Do (KR); Woo Joon Lee, Gyunggi-Do (KR); Sang Huk Kim, Gyunggi-Do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 85 days.

(21) Appl. No.: 13/955,598

(22) Filed: Jul. 31, 2013

(65) Prior Publication Data
US 2014/0318844 A1 Oct. 30, 2014

(30) Foreign Application Priority Data
Apr. 24, 2013 (KR) ........................ 10-2013-0045259

(51) Int. Cl.
*H01G 4/06* (2006.01)
*H01G 4/228* (2006.01)
(Continued)

(52) U.S. Cl.
CPC . *H01G 2/06* (2013.01); *H01G 4/30* (2013.01); *H05K 1/181* (2013.01); *H05K 3/3442* (2013.01); *H05K 2201/10015* (2013.01)

(58) Field of Classification Search
CPC ........... H01G 2/06; H01G 4/30; H05K 1/181; H05K 2201/10015; H05K 3/3442

USPC ............ 361/301.1, 301.4, 303, 306.1, 306.3, 361/313, 320, 321.1, 321.2, 321.3, 760, 782
See application file for complete search history.

(56) References Cited

U.S. PATENT DOCUMENTS 4,205,364 A * 5/1980 Pereira, Jr. .................. 361/274.1
5,388,024 A * 2/1995 Galvagni ...................... 361/309
(Continued)

FOREIGN PATENT DOCUMENTS

JP 5-74644 A 3/1996
JP 09-260184 A 10/1997
(Continued)

OTHER PUBLICATIONS

Korean Office Action issued in Korean Application No. 10-2013-0045259 dated Jun. 12, 2014, w/English translation.
(Continued)

*Primary Examiner* — Hoa C Nguyen
(74) *Attorney, Agent, or Firm* — McDermott Will & Emery LLP

(57) ABSTRACT

There are provided a multilayer ceramic electronic component and a mounting board therefor, the multilayer ceramic electronic component including a ceramic body having a hexahedral shape, including dielectric layers, and satisfying T/W>1.0 when a length of the ceramic body is defined as L, a width of a lower surface of the ceramic body is defined as W, and a thickness of the ceramic body is defined as T, and first and second internal electrodes stacked in the ceramic body so as to face each other, having the respective dielectric layers interposed therebetween, wherein when a width of an upper surface of the ceramic body is defined as Wa, $0.800 \leq Wa/W \leq 0.985$ is satisfied.

10 Claims, 3 Drawing Sheets

(51) Int. Cl.
*H01G 2/06* (2006.01)
*H01G 4/30* (2006.01)
*H05K 1/18* (2006.01)
*H05K 3/34* (2006.01)

(56) References Cited

U.S. PATENT DOCUMENTS

2005/0088803 A1    4/2005  Umeda et al.
2005/0128678 A1*   6/2005  Hidaka et al. ................. 361/305
2012/0215288 A1*   8/2012  Zhang et al. .................... 607/72
2013/0020905 A1*   1/2013  Sawada et al. ................ 310/311
2013/0027839 A1    1/2013  Kim

FOREIGN PATENT DOCUMENTS

JP    09-260196 A      10/1997
JP    2003-318073 A    11/2003
JP    2005-129802 A    5/2005
JP    2010-067721 A    3/2010
JP    2013-30754 A     2/2013

OTHER PUBLICATIONS

Japanese Office Action issued in Japanese Application No. 2013-147293 dated Jan. 21, 2014.

* cited by examiner

MULTILAYER CERAMIC ELECTRONIC COMPONENT AND MOUNTING BOARD THEREFOR

CROSS-REFERENCE TO RELATED APPLICATIONS

This application claims the priority of Korean Patent Application No. 10-2013-0045259 filed on Apr. 24, 2013, in the Korean Intellectual Property Office, the disclosure of which is incorporated herein by reference.

BACKGROUND OF THE INVENTION

1. Field of the Invention

The present invention relates to a multilayer ceramic electronic component and a mounting board therefor.

2. Description of the Related Art

In accordance with the recent trend for the miniaturization of electronic products, demand for a multilayer ceramic electronic component having a small size and high capacitance has increased.

Therefore, dielectric layers and internal electrodes have been thinned and stacked in increasing amounts through various methods. Recently, as a thickness of individual dielectric layers has been reduced, multilayer ceramic electronic components having increased amounts of stacked layers included therein have been manufactured.

Therefore, multilayer ceramic electronic components may be miniaturized, and the dielectric layers and internal electrodes may be thinned, such that the dielectric layers and internal electrodes have been stacked in increasing amounts in order to implement a high degree of capacitance.

As described above, multilayer ceramic electronic components have been miniaturized and the number of stacked layers included therein has increased, such that multilayer ceramic electronic components have thicknesses greater than widths thereof, thereby implementing a high degree of capacitance. However, a defect in which a chip topples over when the multilayer ceramic electronic component is mounted on a board may be frequently generated with the use of such multilayer ceramic electronic components.

In addition, in the case in which the multilayer ceramic electronic component has a thickness larger than a width thereof, a tombstone defect, that is, a Manhattan phenomenon, in which the electronic component slantingly stands up due to the surface tension of solder at the time of being mounted on the board, may be generated.

Therefore, research into a technology of improving reliability by preventing defects in which the multilayer ceramic electronic components topple over when being mounted on the board and preventing tombstone defects, while implementing a high degree of capacitance is in demand.

RELATED ART DOCUMENT (Patent Document 1) Japanese Patent Laid-Open Publication No. JP 2005-129802

SUMMARY OF THE INVENTION

An aspect of the present invention provides a multilayer ceramic electronic component and a mounting board therefor.

According to an aspect of the present invention, there is provided a multilayer ceramic electronic component including: a ceramic body having a hexahedral shape, including dielectric layers, and satisfying T/W>1.0 when a length of the ceramic body is defined as L, a width of a lower surface of the ceramic body is defined as W, and a thickness of the ceramic body is defined as T; and first and second internal electrodes stacked in the ceramic body so as to face each other, having the respective dielectric layers interposed therebetween, wherein when a width of an upper surface of the ceramic body is defined as Wa, $0.800 \leq Wa/W \leq 0.985$ is satisfied.

When an average thickness of the dielectric layers is defined as td, $0.1\ \mu m \leq td \leq 0.6\ \mu m$ may be satisfied.

The first and second internal electrodes may respectively have a thickness of 0.6 µm or less.

The dielectric layers may be stacked in an amount of 500 layers or more.

The first and second internal electrodes may be stacked in a thickness direction of the ceramic body.

According to another aspect of the present invention, there is provided a mounting board for a multilayer ceramic electronic component, the mounting board including: a printed circuit board having first and second electrode pads disposed thereon; and a multilayer ceramic electronic component mounted on the printed circuit board, wherein the multilayer ceramic electronic component includes: a ceramic body having a hexahedral shape, including dielectric layers, and satisfying T/W>1.0 when a length of the ceramic body is defined as L, a width of a lower surface of the ceramic body is defined as W, and a thickness of the ceramic body is defined as T; and first and second internal electrodes stacked in the ceramic body so as to face each other, having the respective dielectric layers interposed therebetween, and when a width of an upper surface of the ceramic body is defined as Wa, $0.800 \leq Wa/W \leq 0.985$ is satisfied.

When an average thickness of the dielectric layers is defined as td, $0.1\ \mu m \leq td \leq 0.6\ \mu m$ may be satisfied.

The first and second internal electrodes may respectively have a thickness of 0.6 µm or less.

The dielectric layers may be stacked in an amount of 500 layers or more.

The first and second internal electrodes may be stacked in a thickness direction of the ceramic body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
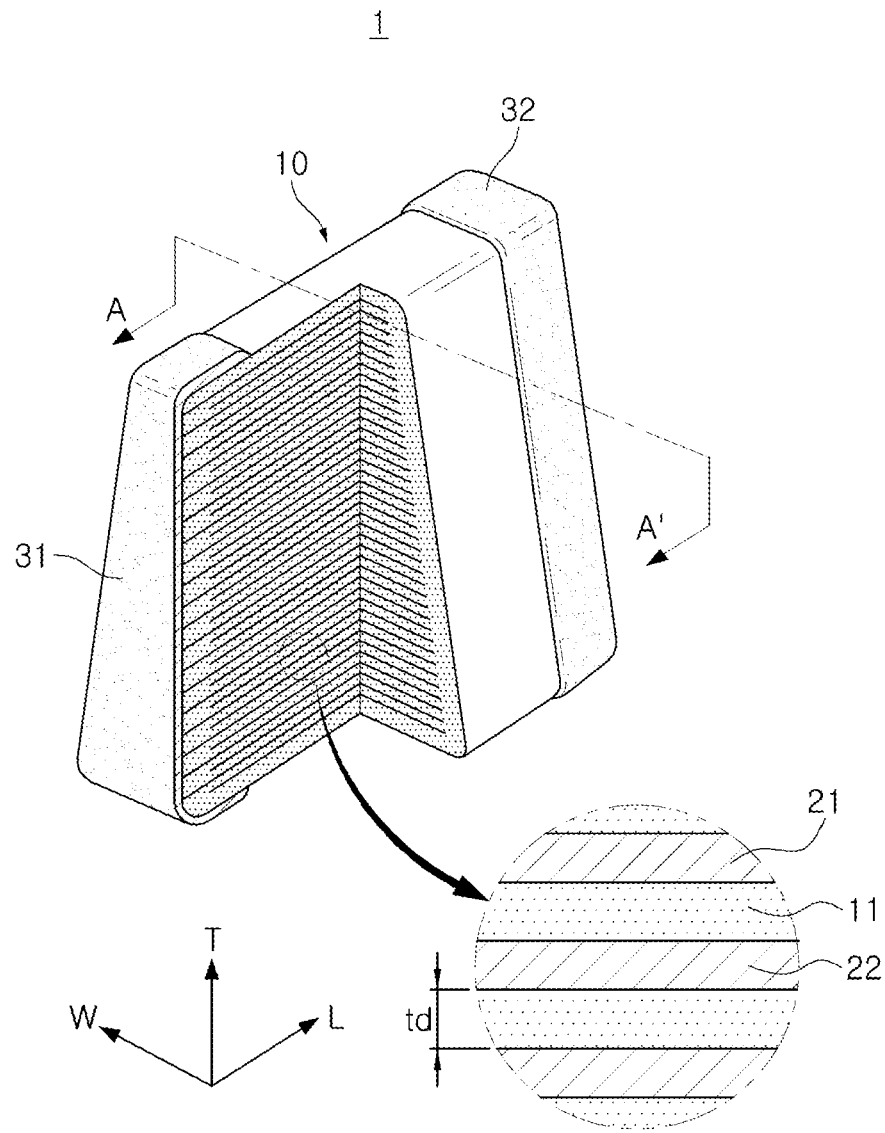
FIG. 1 is a partially cut-away perspective view schematically showing a multilayer ceramic capacitor according to an embodiment of the present invention.

Embodiments of the present invention may be modified in many different forms and the scope of the invention should not be limited to the embodiments set forth herein. Rather, these embodiments are provided so that this disclosure will be thorough and complete, and will fully convey the concept of the invention to those skilled in the art. In the drawings, the shapes and dimensions may be exaggerated for clarity, and the same reference numerals will be used throughout to designate the same or like components.

Multilayer Ceramic Capacitor

Hereinafter, embodiments of the present invention will now be described in detail with reference to the accompanying drawings.

FIG. 1 is a partially cut-away perspective view schematically showing a multilayer ceramic capacitor according to an embodiment of the present invention.

Figure 2:
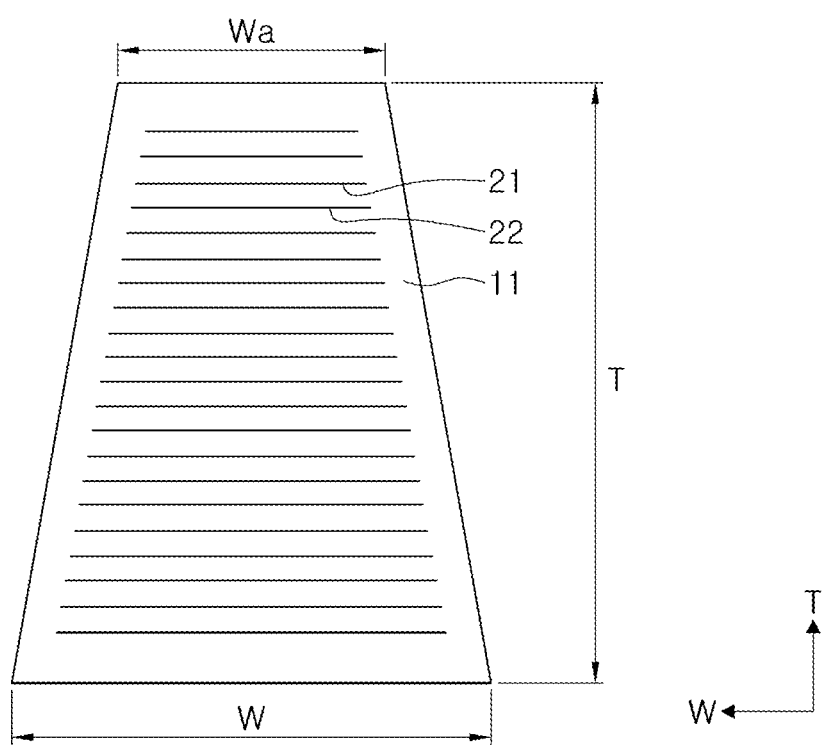
FIG. 2 is a cross-sectional view showing the multilayer ceramic capacitor of FIG. 1 cut in a width direction.

FIG. 2 is a cross-sectional view showing the multilayer ceramic capacitor of FIG. 1 cut in a width direction.

Referring to FIGS. 1 and 2, the multilayer ceramic electronic component according to the embodiment of the present invention may include: a ceramic body 10 having a hexahedral shape, including dielectric layers 11, and satisfying T/W>1.0 when a length of the ceramic body is defined as L, a width of a lower surface of the ceramic body is defined as W, and a thickness of the ceramic body is defined as T; and first and second internal electrodes 21 and 22 stacked in the ceramic body 10 so as to face each other, having the respective dielectric layers 11 interposed therebetween.

Hereinafter, the multilayer ceramic electronic component according to the embodiment of the present invention will be described. Particularly, a multilayer ceramic capacitor will be described by way of example. However, the present invention is not limited thereto.

The ceramic body 10 is not particularly limited in view of a shape, and for example, may have a hexahedral shape.

Meanwhile, in the multilayer ceramic capacitor according to the embodiment of the present invention, a 'length direction' is defined as an 'L' direction, a 'width direction' is defined as a 'W' direction, and a 'thickness direction' is defined as a 'T' direction of FIG. 1. Here, the 'thickness direction' may be used as the same meaning as a direction in which the dielectric layers are stacked (that is, a stacking direction).

A multilayer ceramic capacitor 1 according to the embodiment of the present invention may include: the ceramic body 10 having a hexahedral shape, including the dielectric layers 11, and satisfying T/W>1.0 when a length of the ceramic body is defined as L, a width of a lower surface of the ceramic body is defined as W, and a thickness of the ceramic body is defined as T; and the first and second internal electrodes 21 and 22 stacked in the ceramic body 10 so as to face each other, having the respective dielectric layers 11 interposed therebetween.

A material forming the first and second internal electrodes 21 and 22 is not particularly limited, but may be a conductive paste formed of at least one of, example, a precious metal such as palladium (Pd), a palladium-silver (Pd—Ag) alloy, and the like, nickel (Ni), and copper (Cu).

In addition, the dielectric layers 11 may include a ceramic powder having a high dielectric constant, for example, a barium titanate ($BaTiO_3$) based powder, or a strontium titanate ($SrTiO_3$) based powder. However, the present invention is not limited thereto.

Meanwhile, the first and second internal electrodes 21 and 22 may be a pair of electrodes having different polarities and may be formed on the respective dielectric layers 11 by printing a conductive paste including a conductive metal at a predetermined thickness.

An average thickness of the first and second internal electrodes 21 and 22 after sintering is not particularly limited as long as capacitance may be formed thereby. For example, the average thickness of the first and second internal electrodes may be 0.6 µm or less.

The average thickness of the first and second internal electrodes 21 and 22 may be measured from an image obtained by scanning a cross-section of the ceramic body 10 in a width direction using scanning electron microscope (SEM), as shown in FIG. 2.

For example, as shown in FIG. 2, the average thickness may be calculated by measuring respective thicknesses of an internal electrode at thirty points thereof having equal intervals therebetween in a width direction, with respect to the internal electrode extracted from the image obtained by scanning the cross-section of the ceramic body 10 in a width-thickness (W-T) direction cut in a central portion of the ceramic body 10 in a length direction L, using the scanning electron microscope (SEM).

The thirty points having equal intervals therebetween may be measured in a capacitance formation part, and the capacitance formation part refers to a region in which the first and second internal electrodes 21 and 22 overlap each other.

In addition, in the case in which the measurement of the average thickness is applied to ten or more internal electrodes, such that the average of thicknesses of ten or more internal electrodes is measured, the average thickness of the internal electrodes may be significantly generalized.

Further, the first and second internal electrodes 21 and 22 may be formed to be alternately exposed through both end surfaces of the ceramic body 10 in the stacking direction of the dielectric layers 11, and may be electrically insulated from each other by the dielectric layers 11 disposed therebetween.

That is, the first and second internal electrodes 21 and 22 may be electrically connected to first and second external electrodes 31 and 32, respectively, through portions thereof in which the first and second internal electrodes 21 and 22 are alternately exposed through both end surfaces of the ceramic body 10.

Therefore, in the case in which voltage is applied to the first and second external electrodes 31 and 32, electric charges are accumulated between the first and second internal electrodes 21 and 22 facing each other. Here, capacitance of the multilayer ceramic capacitor 1 may be in proportion to an area of the region in which the first and second internal electrodes 21 and 22 overlap each other.

In order to form capacitance, the first and second external electrodes 31 and 32 may be formed on outer surfaces of the ceramic body 10 and may be electrically connected to the first and second internal electrodes 21 and 22, respectively.

The first and second external electrodes 31 and 32 may be formed of the same conductive material as that of the internal electrodes, but are not limited thereto. For example, the first and second external electrodes 31 and 32 may be formed of copper (Cu), silver (Ag), nickel (Ni), or the like.

The first and second external electrodes 31 and 32 may be formed by applying a conductive paste prepared by adding a glass frit to a metal powder to the outer surfaces of the ceramic body 10 and performing a sintering process.

The ceramic body 10 may be formed through a sintering process after stacking the plurality of dielectric layers 11 and in this case, a shape and a dimension of the ceramic body 10, and the number of the stacked dielectric layers 11 are not limited to being illustrated in the embodiment of the present invention, but the present invention is not limited thereto.

In addition, the plurality of dielectric layers 11 forming the ceramic body 10 may be in a sintered state and be integrated so as not to confirm boundaries between the adjacent dielectric layers without the scanning electron microscope (SEM).

According to the embodiment of the present invention, an average thickness td of the dielectric layers 11 may be arbitrarily changed according to a capacitance design of the multilayer ceramic capacitor 1, but may be 0.1 to 0.6 µm after the sintering process.

The average thickness td of the dielectric layers 11 may be measured from an image obtained by scanning the cross-section of the ceramic body 10 in the width direction using the SEM, as shown in FIG. 2.

For example, as shown in FIG. 2, the average thickness may be calculated by measuring respective thicknesses of a dielectric layer at thirty points thereof having equal intervals therebetween in a width direction, with respect to the dielectric layer extracted from the image obtained by scanning the cross-section of the ceramic body 10 in the width-thickness (W-T) direction cut in a central portion of the ceramic body 10 in the length direction L, using the scanning electron microscope (SEM).

The thirty points having equal intervals therebetween may be measured in the capacitance formation part, and the capacitance formation part refers to the region in which the first and second internal electrodes 21 and 22 overlap each other.

In addition, in the case in which the measurement of the average thickness is applied to ten or more dielectric layers, such that the average of thicknesses of ten or more dielectric layers is measured, the average thickness of the dielectric layers may be significantly generalized.

The number of stacked dielectric layers 11 is not particularly limited, but for example, 500 or more dielectric layers 11 may be stacked.

As described above, 500 or more dielectric layers 11 may be stacked, such that a high capacitance multilayer ceramic capacitor in which the thickness T of the ceramic body is greater than the width W of the ceramic body may be implemented.

Meanwhile, when the length of the ceramic body 10 is defined as L, the width thereof is defined as W, and the thickness thereof is defined as T, T/W>1.0 may be satisfied.

In the multilayer ceramic capacitor 1 according to the embodiment of the present invention, the number of stacked dielectric layers may be increased in order to implement high capacitance, and the ceramic body 10 may have the thickness T thereof larger than the width W thereof.

A general multilayer ceramic capacitor has been manufactured in such a manner that the width and the thickness thereof are almost identical to each other.

However, since the multilayer ceramic capacitor according to the embodiment of the present invention may be miniaturized, a sufficient space may be secured at the time of mounting the multilayer ceramic capacitor on a board, such that the number of stacked layers may be increased in order to implement the multilayer ceramic capacitor having high capacitance.

As the number of stacked layers is increased as described above, a relationship between the thickness T and the width W of the ceramic body may satisfy T/W>1.0, since the stacking direction of the dielectric layers in the ceramic body is the equivalent of the thickness direction.

According to the embodiment of the present invention, the multilayer ceramic capacitor is manufactured in such a manner that the relationship between the thickness T and the width W of the ceramic body satisfies T/W>1.0, whereby a multilayer ceramic capacitor having high capacitance may be implemented.

Meanwhile, as the multilayer ceramic capacitor is manufactured in such a manner that the relationship between the thickness T and the width W of the ceramic body satisfies T/W>1.0, the multilayer ceramic capacitor may topples over when being mounted on the board to cause defects in reliability such as a short-circuit and the like.

In addition, in the case in which the multilayer ceramic electronic component has a thickness thereof larger than a width thereof, a tombstone defect, that is, a Manhattan phenomenon in which the electronic component slantingly stands up due to surface tension of solder at the time of being mounted on the board may be generated.

However, according to the embodiment of the present invention, when a width of an upper surface of the ceramic body 10 is defined as Wa, in a relationship between Wa and W (W refers to the width of the lower surface of the ceramic body 10), $0.800 \leq Wa/W \leq 0.985$ may be satisfied, whereby the occurrence of short-circuit defects due to the multilayer ceramic electronic component toppling over when being mounted on the board may be prevented.

In addition, a tombstone defect, that is, a Manhattan phenomenon in which the multilayer ceramic capacitor 1 may slantingly stand up due to the surface tension of solder at the time of being mounted on the board may be generated.

That is, the width Wa of the upper surface of the ceramic body 10 is smaller than the width W of the lower surface thereof, such that the cross-section of the ceramic body 10 in the width-thickness (W-T) direction may have a trapezoidal shape.

The width Wa of the upper surface of the ceramic body 10 is smaller than the width W of the lower surface thereof as described above, whereby short-circuit defects due to the electronic component toppling over and tombstone defects in which the electronic component slantingly stands up due to the surface tension of solder when being mounted on the board may be prevented.

The multilayer ceramic capacitor 1 is manufactured as described above, such that even in the case in which the relationship between the thickness T and the width W of the ceramic body 10 satisfies T/W>1.0, the multilayer ceramic capacitor may not topple over or may not be inclined when being mounted on the board, thereby having excellent reliability.

In the case in which the ratio Wa/W of the width Wa of the upper surface of the ceramic body 10 to the width W of the lower surface of the ceramic body 10 is less than 0.800, an overlap area between the first and second internal electrodes 21 and 22 may be decreased to deteriorate capacitance.

Meanwhile, in the case in which the ratio Wa/W of the width Wa of the upper surface of the ceramic body 10 to the width W of the lower surface of the ceramic body 10 is greater than 0.985, a difference between the width Wa of the upper surface of the ceramic body 10 and the width W of the lower surface of the ceramic body 10 is insignificant, such that the electronic component may topple over or tombstone defects may be generated when the electronic component is mounted on the board.

Hereinafter, although the present invention will be described in detail with reference to comparative examples and inventive examples, the present invention is not limited thereto.

In inventive examples, whether or not a multilayer ceramic capacitor topples over when being mounted on a board in accordance with the ratio Wa/W of the width Wa of the upper surface of the ceramic body 10 to the width W of the lower surface of the ceramic body 10 was tested, with respect to multilayer ceramic capacitors each including the dielectric layers 11 having the average thickness of 0.6 μm or less.

The multilayer ceramic capacitors according to the inventive examples of the present invention were respectively manufactured as follows.

First, a slurry containing a barium titanate ($BaTiO_3$) powder having an average particle diameter of 0.1 μm, was applied to carrier films and dried thereon to prepare a plurality of ceramic green sheets having thicknesses of 1.05 μm and 0.95 μm, thereby forming the dielectric layers 11.

Then, a conductive paste for an internal electrode including 40 to 50 parts by weight of a nickel powder having a nickel particle average diameter of 0.1 to 0.2 μm was prepared.

After the conductive paste for an internal electrode was applied to the green sheets by a screen printing method to thereby form internal electrodes, 500 or more dielectric layers were stacked to thereby form a stacked body.

Then, the stacked body was compressed and cut to thereby form chips each having a ratio of thickness to width of greater than 1.0 and a size of a 0603 (length×width) standard, and the chips were sintered at a temperature of 1050 to 1200° C. under a reducing atmosphere in which $H_2$ is included in an amount of 0.1% or less.

Next, the chips were subjected to processes such as a process of forming external electrodes and a process forming a plating layer, and the like, such that the multilayer ceramic capacitors were manufactured.

Mounting Board for Multilayer Ceramic Capacitor

Figure 3:
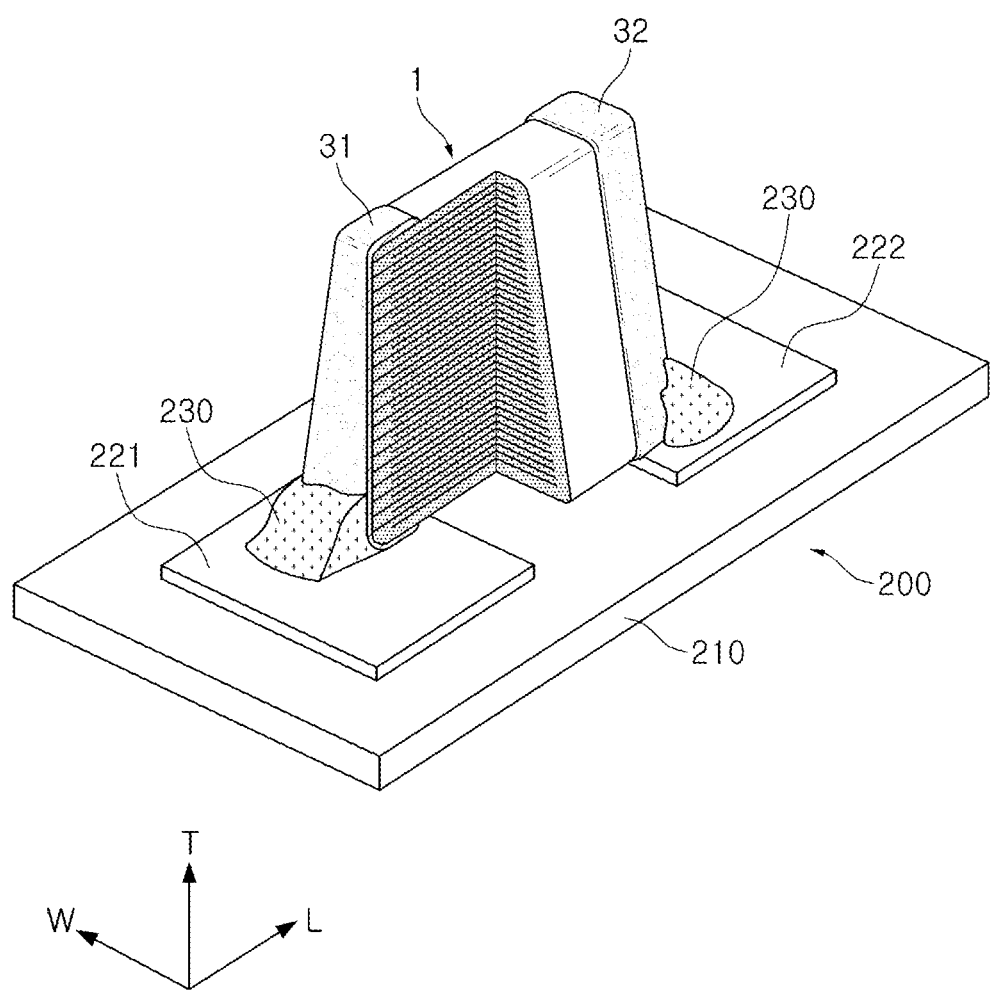
FIG. 3 is a perspective view showing a state in which the multilayer ceramic capacitor of FIG. 1 is mounted on a printed circuit board.

FIG. 3 is a perspective view showing a state in which the multilayer ceramic capacitor of FIG. 1 is mounted on a printed circuit board.

Referring to FIG. 3, a mounting board 200 for the multilayer ceramic capacitor 1 according to the embodiment of the present invention may include: a printed circuit board 210 having the multilayer ceramic capacitor 1 mounted thereon so as to be parallel therewith, and first and second electrode pads 221 and 222 formed on an upper surface of the printed circuit board 210 so as to be spaced apart from each other.

Here, the first and second external electrodes 31 and 32 of the multilayer ceramic capacitor 1 may be electrically connected to the printed circuit board 210 by a soldering part 230 while being positioned to contact the first and second electrode pads 221 and 222, respectively.

The mounting board for the multilayer ceramic electronic component according to another embodiment of the present invention as described above may have a multilayer ceramic electronic component mounted thereon, the multilayer ceramic electronic component including a ceramic body having a hexahedral shape, including dielectric layers, and satisfying T/W>1.0 when a length of the ceramic body is defined as L, a width of a lower surface of the ceramic body is defined as W, and a thickness of the ceramic body is defined as T and in this case, the multilayer ceramic electronic component may include a high capacitance multilayer ceramic capacitor.

In addition, in the mounting board for the multilayer ceramic electronic component according to another embodiment of the present invention as described above, even in the case in which the multilayer ceramic capacitor is mounted on the mounting board, the relationship between the width Wa of the upper surface of the ceramic body 10 and the width W of the lower surface of the ceramic body 10 satisfies 0.800≤Wa/W≤0.985, such that short-circuit defects due to the multilayer ceramic electronic component toppling over when being mounted on the board may be prevented.

Further, a tombstone defect, that is, a Manhattan phenomenon in which the multilayer ceramic capacitor 1 slantingly stands up due to the surface tension of solder when being mounted on the board may be prevented.

Therefore, the mounting board for the multilayer ceramic electronic component including the multilayer ceramic capacitor having high capacitance and excellent reliability may be implemented.

As set forth above, according to embodiments of the present invention, a multilayer ceramic electronic component having high capacitance as well as excellent reliability can be implemented.

More specifically, according to the embodiments of the present invention, defects in which the multilayer ceramic electronic component having high capacitance topples over when being mounted on a board can be prevented, and tombstone defects can be prevented.

Therefore, the multilayer ceramic electronic component having high capacitance and excellent reliability can be implemented.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component, comprising:
    a ceramic body having a hexahedral shape, including dielectric layers, and satisfying T/W>1.0 when a length of the ceramic body is defined as L, a width of a lower surface of the ceramic body is defined as W, and a thickness of the ceramic body is defined as T; and
    first and second internal electrodes stacked in the ceramic body so as to face each other, having the respective dielectric layers interposed therebetween,
    wherein when a width of an upper surface of the ceramic body is defined as Wa, 0.800≤Wa/W≤0.985 is satisfied.

2. The multilayer ceramic electronic component of claim 1, wherein when an average thickness of the dielectric layers is defined as td, 0.1 μm≤td≤0.6 μm is satisfied.

3. The multilayer ceramic electronic component of claim 1, wherein the first and second internal electrodes respectively have a thickness of 0.6 μm or less.

4. The multilayer ceramic electronic component of claim 1, wherein the dielectric layers are stacked in an amount of 500 layers or more.

5. The multilayer ceramic electronic component of claim 1, wherein the first and second internal electrodes are stacked in a thickness direction of the ceramic body.

6. A mounting board for a multilayer ceramic electronic component, the mounting board comprising:
    a printed circuit board having first and second electrode pads disposed thereon; and
    a multilayer ceramic electronic component mounted on the printed circuit board,
    wherein the multilayer ceramic electronic component includes: a ceramic body having a hexahedral shape, including dielectric layers, and satisfying T/W>1.0 when a length of the ceramic body is defined as L, a width of a lower surface of the ceramic body is defined as W, and a thickness of the ceramic body is defined as T; and first and second internal electrodes stacked in the ceramic body so as to face each other, having the respective dielectric layers interposed therebetween, and when a width of an upper surface of the ceramic body is defined as Wa, 0.800≤Wa/W≤0.985 is satisfied.

7. The mounting board of claim 6, wherein when an average thickness of the dielectric layers is defined as td, 0.1 μm≤td≤0.6 μm is satisfied.

8. The mounting board of claim 6, wherein the first and second internal electrodes respectively have a thickness of 0.6 μm or less.

9. The mounting board of claim 6, wherein the dielectric layers are stacked in an amount of 500 layers or more.

10. The mounting board of claim 6, wherein the first and second internal electrodes are stacked in a thickness direction of the ceramic body.

* * * * *